United States Patent
Moallem et al.

(10) Patent No.: US 10,862,192 B2
(45) Date of Patent: Dec. 8, 2020

(54) NON-CONTACT TEST SOLUTION FOR ANTENNA-ON-PACKAGE (AOP) DEVICES USING NEAR-FIELD COUPLED RF LOOPBACK PATHS

(71) Applicant: TEXAS INSTRUMENTS INCORPORATED, Dallas, TX (US)

(72) Inventors: Meysam Moallem, Plano, TX (US);
Guor-Chaur Jung, Plano, TX (US);
Brian P. Ginsburg, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 56 days.

(21) Appl. No.: 16/381,921

(22) Filed: Apr. 11, 2019

(65) Prior Publication Data
US 2020/0194871 A1 Jun. 18, 2020

Related U.S. Application Data

(60) Provisional application No. 62/781,496, filed on Dec. 18, 2018.

(51) Int. Cl.
*H01L 35/00* (2006.01)
*H01Q 1/36* (2006.01)
(Continued)

(52) U.S. Cl.
CPC ....... *H01Q 1/2283* (2013.01); *G01R 31/2893* (2013.01); *G01R 31/2896* (2013.01); *H01Q 1/24* (2013.01)

(58) Field of Classification Search
CPC .... H01Q 1/2283; H01Q 1/24; G01R 31/2893; G01R 31/2896
See application file for complete search history.

(56) References Cited

U.S. PATENT DOCUMENTS

| | | | |
|---|---|---|---|
| 10,031,160 B2* | 7/2018 | Isaac | G01R 1/24 |
| 2009/0153158 A1* | 6/2009 | Dunn | G01R 31/2822 |
| | | | 324/762.01 |

(Continued)

OTHER PUBLICATIONS

Brebels, Steven et al. "SOP Integration and Codesign of Antennas." IEEE Transactions and Advance Packaging, vol. 27, No. 2, May 2004, pp. 341-351.

(Continued)

*Primary Examiner* — Anh Q Tran
(74) *Attorney, Agent, or Firm* — Ebby Abraham; Charles A. Brill; Frank D. Cimino

(57) ABSTRACT

A radio frequency (RF) loopback substrate or printed circuit board (PCB) which contains receive and transmit antennas located on the bottom of the loopback substrate which are aligned with the complementary transmit and receive antennas on an antenna on package (AOP) device under test. The loopback substrate receive and transmit antennas are coupled to each other. The device under test contacts are driven by a conventional tester, which causes RF circuitry in the integrated circuit to drive an AOP transmit antenna. The corresponding loopback substrate receive antenna receives the RF signal from the AOP transmit antenna and provides it to the loopback substrate transmit antennas. The integrated circuit package AOP receive antennas then receive the RF signals from the loopback substrate transmit antennas. The signals at the integrated circuit package AOP receive antennas are monitored through the integrated circuit contacts to monitor the received RF signals.

20 Claims, 10 Drawing Sheets

(51) Int. Cl.
*H01Q 1/22* (2006.01)
*G01R 31/28* (2006.01)
*H01Q 1/24* (2006.01)

(56) References Cited

U.S. PATENT DOCUMENTS

2017/0279491 A1* 9/2017 Lam .................. H04B 3/46
2019/0310314 A1* 10/2019 Liu ................ G01R 31/2822

OTHER PUBLICATIONS

Chang, Y.P. and Duixian Liu. "Antenna-on-Chip- and Antenna-in-Package Solutions to Highly Integrated Millimeter-Devices for Wireles Communications." IEEE Transactions on Antennas and Propagation, vol. 57, No. 10, Oct. 2009, pp. 2830-2841.

Sun, Mei et al. "A Ball Grid Array Package With a Microstrip Grid Array Antenna for a Single-Chip 60-GHz Receiver." IEEE Transactions on Antennas and Propagation, vol. 59, No. 6, Jun. 2011, pp. 2134-2140.

Zhihong, Tu et al. "Tri-band Antenna in Package for Single-chip WLAN/60GHz Radio." 2012 IEEE Asia-Pacific Conference on Antennas and Propagation, Aug. 27-29, 2012, Singapore.

Ho, Cheng-Yu et al. "A 77GHz Antenna-in-Package with Low-Cost Solution for Automotive Radar Applications." 2018 IEEE 68th Electronics Components and Technology Conference, pp. 191-196.

Texas Instruments. "AWR1642 Single-Chip 77-and 79-GHz FMCW Radar Sensor." May 2017—Revised Apr. 2018. 88 pages.

Texas Instruments. "AWR16xx/14xx" Technical Reference Manual. May 2017—Revised May 2018, pp. 1-2774.

\* cited by examiner

NON-CONTACT TEST SOLUTION FOR ANTENNA-ON-PACKAGE (AOP) DEVICES USING NEAR-FIELD COUPLED RF LOOPBACK PATHS

CROSS REFERENCE TO RELATED APPLICATION

This application claims the benefit under 35 U.S.C. § 119(e) of U.S. Provisional Patent Application Ser. No. 62/781,496 entitled "Non-Contact Test Solution for Antenna-On-Package (AOP) Devices Using Near-Field Coupled RF Loopback Paths" filed Dec. 18, 2018, which is hereby incorporated by reference as if reproduced in its entirety.

BACKGROUND

1. Field

The field relates to testing of integrated circuit packages.

2. Description of the Related Art

After an integrated circuit has been installed in its package or module, the integrated circuit needs to be tested for functionality. This is done using a device called a tester, which makes contact with the integrated circuit package and provides appropriate electrical signals to test the functionality of the integrated circuit. Conventionally, integrated circuit packages or modules have pins or balls on the bottom or sides which are contacted by the tester and test signals are provided through the pins or balls. Recent advances have changed the packaging of radio frequency (RF) integrated circuits so that rather than transmitting the RF signals through the balls or pins to an antenna module, antennas are provided on the top surface of package itself. This is called an AOP or antenna on package configuration. When the RF signals were provided through the pins or balls, it was simple to test the RF circuitry using conventional means on the tester. But because the antennas are not connected to the pins or balls and are provided only on the package in an AOP design, conventional testing methods do not work for testing of the outputs of and inputs to the RF circuits. This has complicated testing of such packages.

SUMMARY

An RF loopback substrate or printed circuit board (PCB) contains receive and transmit antennas located on the bottom of the loopback substrate which are aligned with the complementary transmit and receive antennas on an AOP device under test. The loopback substrate receive and transmit antennas are coupled to each other through a combining and dividing network so that signals received at any receive antenna can be provided to any transmit antennas. The package contacts are driven by a conventional tester, which in turn causes RF circuitry in the integrated circuit to drive an AOP transmit antenna. The corresponding loopback substrate receive antenna receives the RF signal from the AOP transmit antenna and provides it to the loopback substrate transmit antennas. The integrated circuit package AOP receive antennas then receive the RF signals from the loopback substrate transmit antennas. The signals at the integrated circuit package AOP receive antennas are monitored through the integrated circuit contacts as is normal to monitor the received RF signals. This allows testing of both the RF circuitry and the AOP antennas using a conventional tester. The loopback substrate is mounted into an integrated circuit package handler used with the tester to allow the testing to be done automatically in normal fashion.

BRIEF DESCRIPTION OF THE FIGURES

For a detailed description of various examples, reference will now be made to the accompanying drawings in which.

DETAILED DESCRIPTION

Figure 1:
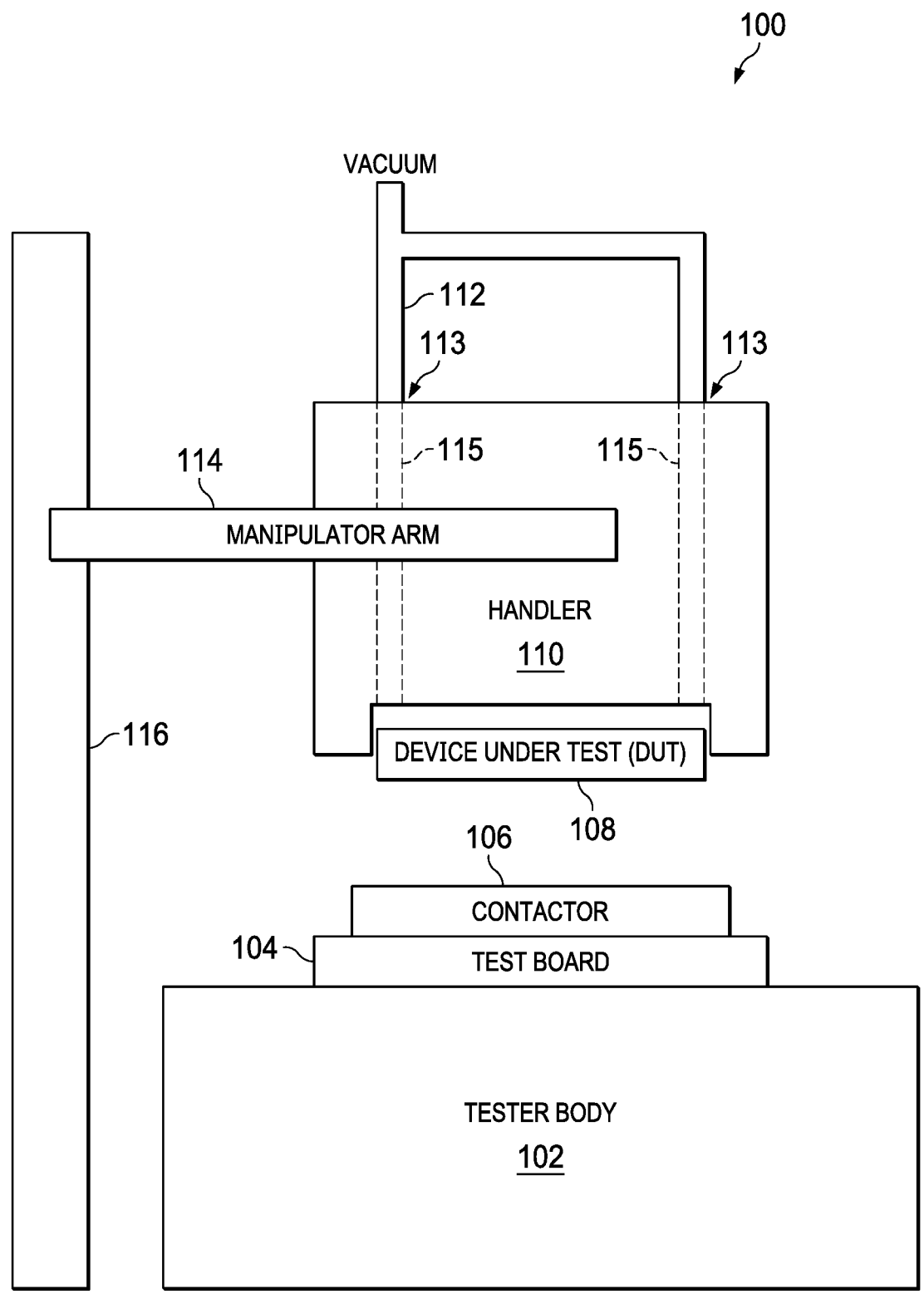
FIG. 1 is a diagram of an integrated circuit tester.

Referring now to FIG. 1, an integrated circuit tester 100 is illustrated. A tester body 102 contains the various computing elements and signal analysis elements of the tester 100. A test board 104 which interfaces between the tester body 102 and a contactor 106 is installed on the tester body 102. Contactor 106 provides an interface between the test board 104 and the actual device under test 108. In operation of the tester 100, the device under test 108 is held by a handler no, with the device under test 108 being held in place in one version by the use of a vacuum provided through a vacuum line 112 connected to ports 113 and internal lines 115. It is understood that the use of vacuum to hold the device under test in the handler is exemplary and other techniques are well known.

An automated handler no is connected to a manipulator arm 114, which is in turn connected to a manipulator gantry 116. The manipulator arm 114 and the manipulator gantry 116 are controlled such that the handler no is movable between a position to pick up a new device to be tested and then move the device to the tester body 102 so that the device under test 108 is connected to the contactor 106 and a test is performed. When the test is completed, the handler no is moved by the manipulator arm 114 and the manipulator gantry 116 to allow the device under test 108 to be deposited in good or bad tested circuit locations. It is understood that this is a very simplified illustration of a tester for purposes of explanation and it is understood that there are many different tester configurations with many distant different handler assemblies and manipulator and gantry assemblies.

Figure 2:
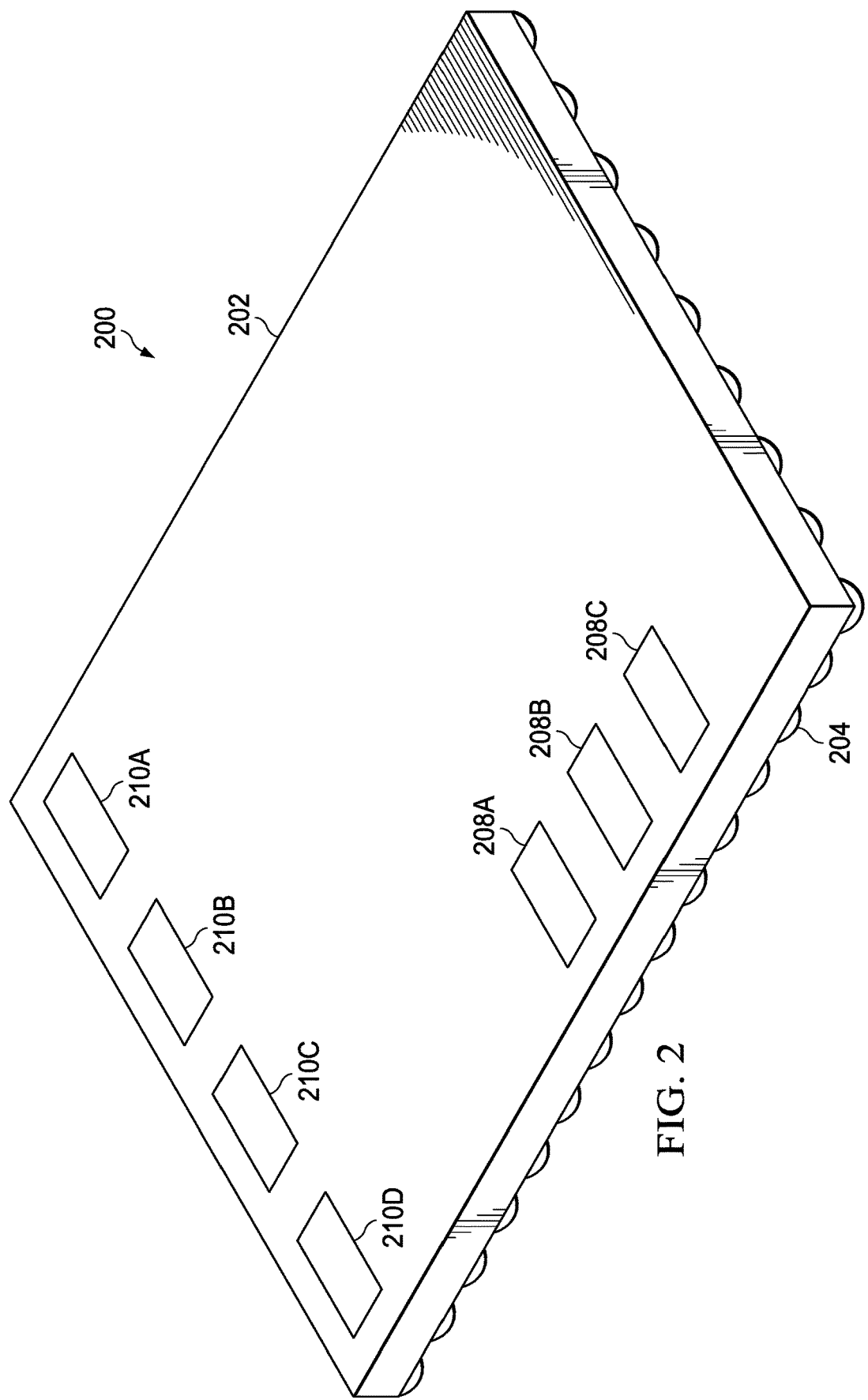
FIG. 2 is a diagram of an integrated circuit package including antennas on the package.

FIG. 2 illustrates an AOP device 200 which is to be tested. The AOP device 200 includes a package or module 202, which contains the integrated circuit. Electrical connections to the contained integrated circuit are made through a series of contacts or balls 204 in the illustrated AOP device 200. It is understood that pins could be utilized instead of balls 204 as is common. Located on the top or upper surface 206 of the package 202 are transmit antennas 208A, 208B and 208C. Receive antennas 210A, 210B, 210C and 210D are also located on the top or upper surface 206 of the package 202. The receive antennas 210A-210D and the transmit antennas 208A-208C are the antennas in the antenna on package design. The transmit antennas 208A-208C are connected internally in the package 202 to RF drivers of the integrated circuit. The receive antennas 210A-210D are connected internally in the package 202 to RF receive buffers of the integrated circuit.

Figure 3:
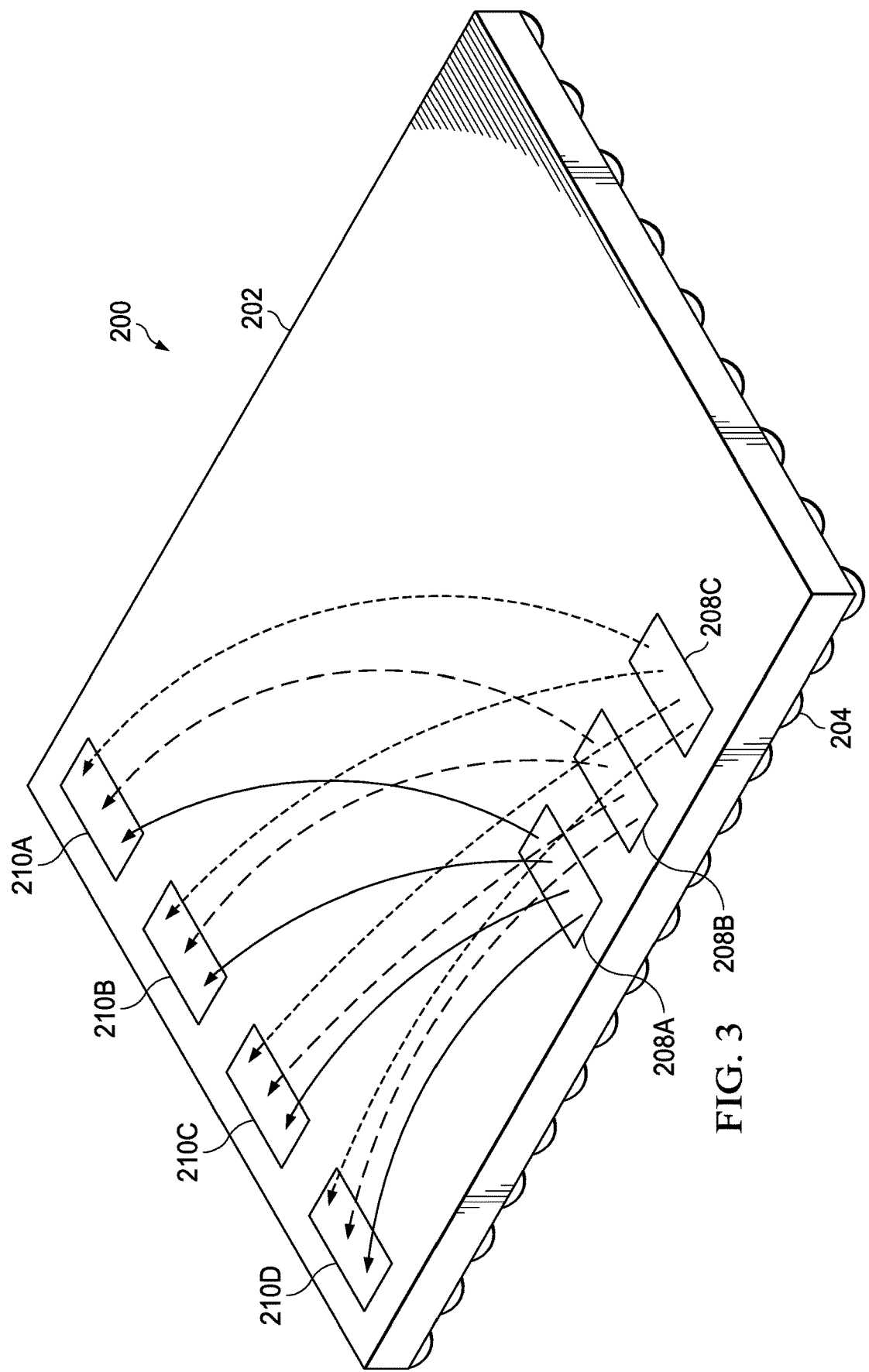
FIG. 3 is a diagram of the integrated circuit package of FIG. 2 with testing relationships illustrated.

FIG. 3 illustrates one variation of signal testing that is to be performed. The arrows in FIG. 3 illustrate that each of the transmit antennas 208A-208C is tested against each of the receive antennas 202A-210D.

Figure 4:
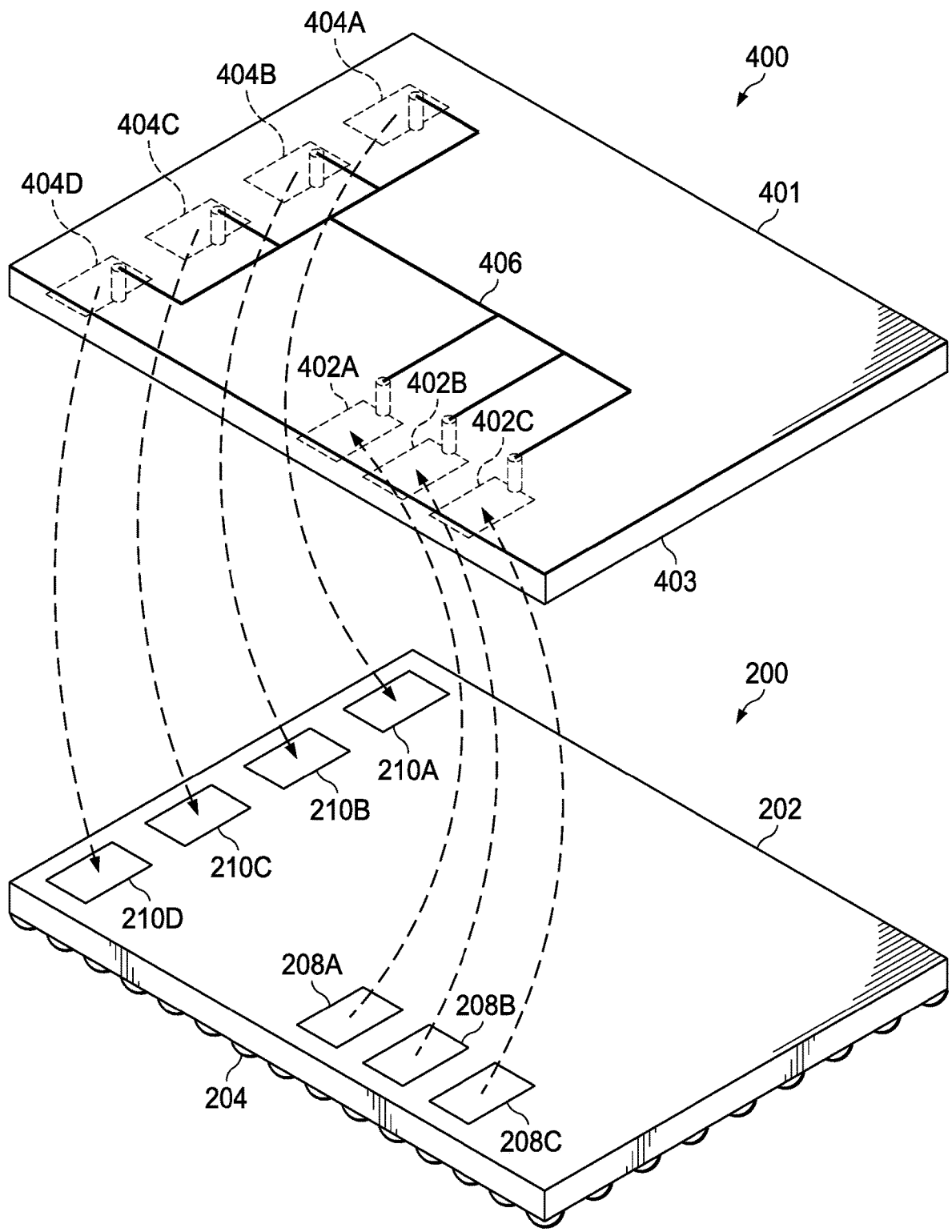
FIG. 4 is a diagram of the integrated circuit package of FIG. 2 in conjunction with an antenna on package loopback substrate or printed circuit board.

FIG. 4 illustrates an RF loopback substrate or PCB 400 in relation to the AOP device 200 to be tested. The RF loopback substrate 400 includes a PCB 401 configured to complement the AOP device 200. Receive antennas 402A, 402B and 402C are located on the bottom surface 403 of the PCB 401 and in locations that are complementary to the transmit antennas 208A, 208B and 208C to form receive-transmit pairs when in operation. Similarly, transmit antennas 404A, 404B, 404C and 404D are present on the bottom surface 403 of the PCB 401 in locations complementary to the receive antennas 210A, 210B, 210C and 210D to form transmit-receive pairs when in operation. The receive antennas 402A-402C are connected to the transmit antennas 404A-404D using an interconnect 406, explained in more detail in FIGS. 4A-4C. The size and shape of the loopback substrate 400 are such that the receive antennas 402A, 402B and 402C and transmit antennas 404A, 404B, 404C and 404D are complementary to the respective transmit antennas 208A, 208B and 208C and receive antennas 210A, 210B, 210C and 210D and are touching or separated by a small gap. The gap may be an air gap.

In operation, the RF loopback substrate 400 is located over and in contact or close to the AOP device 200 under test. Signals are provided to the AOP device 200 through the balls 204 to cause RF signals to be transmitted by each of the RF transmit antennas 208A-208C. The signals provided from a transmit antenna 208A-208C are then received by the complementary receive antenna 402A-402C. The signals are then provided from the receive antenna 402A-402C to the transmit antennas 404A-404D. An RF signal is then provided from the transmit antennas 404A-404D to the receive antennas 210A-210D. The signals received at the receive antennas 210A-210D are then monitored to determine if the RF transmit and RF receive circuitry in the AOP device 200 is functional.

Figure 4A:
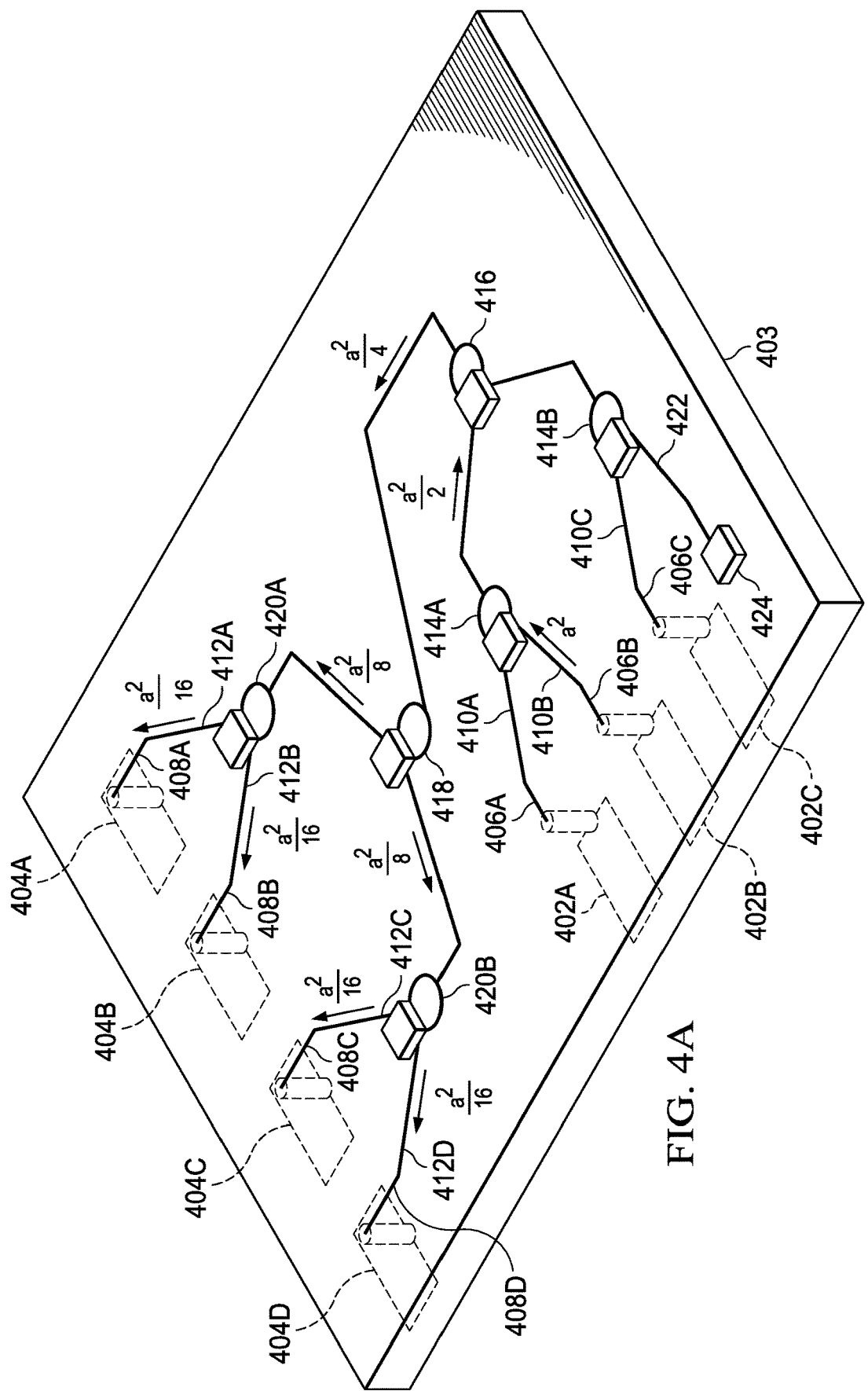
FIG. 4A is a diagram of an interconnect network between the receive antennas and the transmit antennas on a loopback substrate.
Figure 4B:
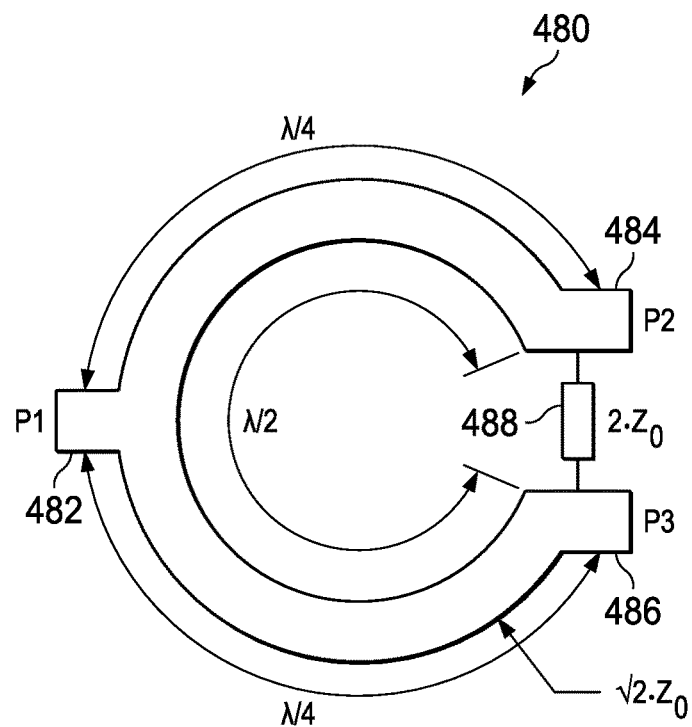
FIG. 4B is a diagram of a Wilkinson divider.
Figure 4C:
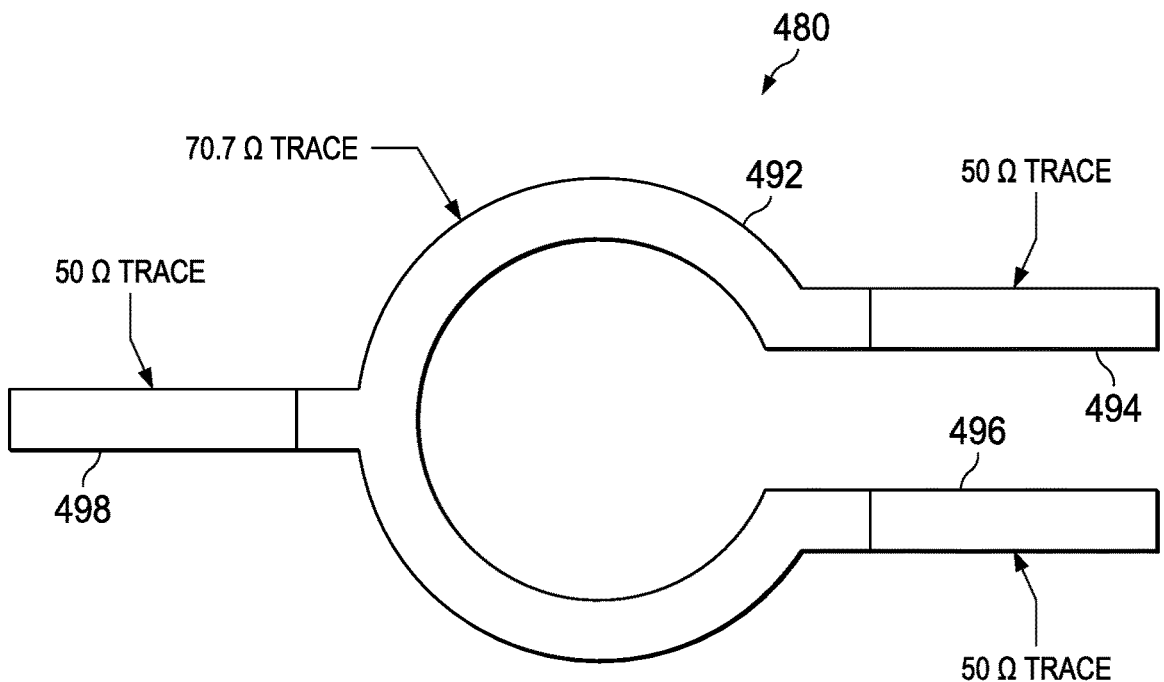
FIG. 4C is a diagram of printed circuit board traces forming the Wilkinson divider of FIG. 4B.

FIGS. 4A-4C provide details on the interconnect 406. In one design the receive antennas 402A, 402B and 402C and the transmit antennas 404A, 404B, 404C and 404D are provided on a first or face down layer of the PCB that is the loopback substrate 400. A feed trace 406A, 406B and 406C is provided in a next layer from respective receive antennas 402A, 402B and 402C, while feed traces 408A, 408B, 408C and 408D are provided in that same layer from respective transmit antennas 404A, 404B, 404C and 404D. A ground layer forms the next layer this design. Vias (not shown) are provided from the feed traces 406A, 406B and 406C to receive microstrip lines 410A, 410B and 410C on a final or top layer. Microstrip lines are used in this design as the design is a radar integrated circuit. Microstrips 412A, 412B, 412C and 412D are connected to the feed traces 408A, 408B, 408C and 408D on the top layer. Microstrip lines 410A and 410B are connected to a Wilkinson divider 414A. Microstrip lines 410C and 422 are connected to a Wilkinson divider 414B. A terminating resistor 424 is connected to microstrip line 422.

A Wilkinson divider is a passive power divider circuit that achieves isolation between the output ports while maintaining a matched condition on all ports. The Wilkinson divider design can also be used as a power combiner because it is made up of passive components and hence reciprocal. Referring to FIGS. 4B and 4C, a Wilkinson divider 480 is shown in more detail. A port P1 482 is the input port if operating as a divider and the output port if operating as a combiner. Ports P2 484 and P3 486 are the output ports if operating as a divider and the input ports if operating as a combiner. A resistor 488 is connected between ports P2 484 and P3 486 as part of the Wilkinson divider configuration. As shown in FIG. 4C, in the one design, the microstrips at each port have a 50Ω impedance. The loop of the Wilkinson divider 480 has a 70.7Ω impedance.

As a power divider, when a signal enters port P1 482, the signal splits into equal-amplitude, equal-phase output signals at ports P2 484 and P3 486. Since each end of the resistor 488 between ports P2 484 and P3 486 is at the same potential, no current flows through it and therefore the resistor 488 is decoupled from the input. As a power combiner, a signal is input at port P2 484. In this case, the signal splits equally between port P1 482 and the resistor 488 with none appearing at port P3 486. The resistor 488 thus serves the function of decoupling ports P2 484 and P3 486. Note that for a signal input at either port P2 484 or P3 486, half the power is dissipated in the resistor 488 and half is delivered to port P1 482.

Wilkinson dividers 414A and 414B are configured as power combiners. In FIG. 4A, a signal with power $a^2$ is provided from receive antenna 402B to Wilkinson divider 414A. A signal with power $$\frac{a^2}{2}$$

is provided from the Wilkinson divider 414A to a Wilkinson divider 416 acting as a combiner for the outputs of Wilkinson divider 414A and Wilkinson divider 414B. A signal with power $$\frac{a^2}{4}$$

is provided from the Wilkinson divider 416 to a Wilkinson divider 418 acting as a divider. A signal with power $$\frac{a^2}{8}$$

is provided from the outputs of the Wilkinson divider 418 to the inputs of Wilkinson dividers 420A and 420B. The outputs of Wilkinson divider 420A have a signal with a power of $$\frac{a^2}{16}$$

and are connected to microstrips 412A and 412B, so that transmit antennas 404A, 404B each receive a signal with a power of $$\frac{a^2}{16}.$$

The outputs of Wilkinson divider 420B have a signal with a power of $$\frac{a^2}{16}$$

and are connected to microstrips 412C and 412D, so that transmit antenna 404C, 404D receive a signal with a power of $$\frac{a^2}{16}$$

and a resistor 424 connected to microstrip 422 receives a signal with a power of $$\frac{a^2}{16}.$$

Thus, driving any one of the transmit antennas 208A-208C results in an equal signal at each of the receive antennas 201A-210D when everything is operating correctly. In one design the insertion loss from the receive antenna 402A-402C to the transmit antennas 404A-404D is 15 to 17 db, which is 3 db per Wilkinson divider and 3 to 5 db for trace loss.

If the AOP device 200 has only one transmit antenna and one receive antenna, the Wilkinson dividers are not necessary and the receive antenna and the transmit antenna on the loopback substrate 400 can be directly connected by a microstrip.

While Wilkinson dividers are appropriate for the radar frequencies of the one design, in other designs other passive RF dividers, combiners, splitters, hybrids and couplers can be used as appropriate for the relevant signal frequency. Active components can be utilized as well, though provisions must be made to provide power while in the handler.

Figure 5:
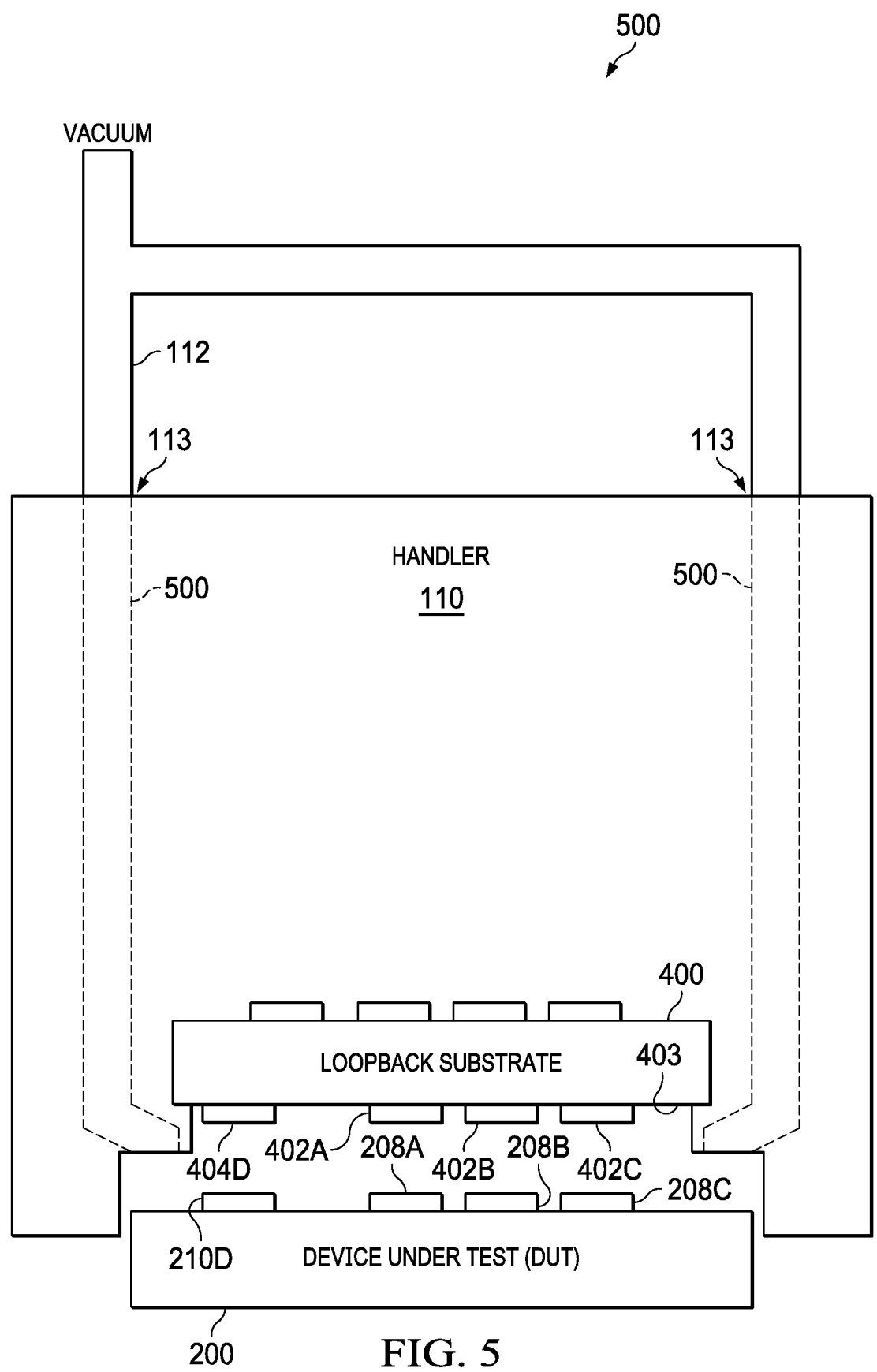
FIG. 5 is a diagram of the antenna on package loopback substrate of FIG. 4 installed in the handler with an integrated circuit package to be tested.

FIG. 5 illustrates the relationship of the AOP device 200 and the RF loopback substrate 400 when the RF loopback substrate 400 is installed in the handler 110 and the AOP device 200 is near location in the handler no. This shows a good view of the proximity of the transmit antennas 208A-208C and the receive antennas 402A-402C. Similarly, the relationship between the transmit antenna 404D and the receive antenna 210D is illustrated. The distance or gap between the antennas is preferably a nominal amount, such as between zero and 0.2 mm. Direct contact or zero distance is possible as a thin layer of solder-resist covers the antennas on the AOP device 200. The internal lines 115 have been modified to internal lines 500 in the illustration of FIG. 5 to clear the loopback substrate 400 and yet properly cooperate with the device under test.

Figure 6:
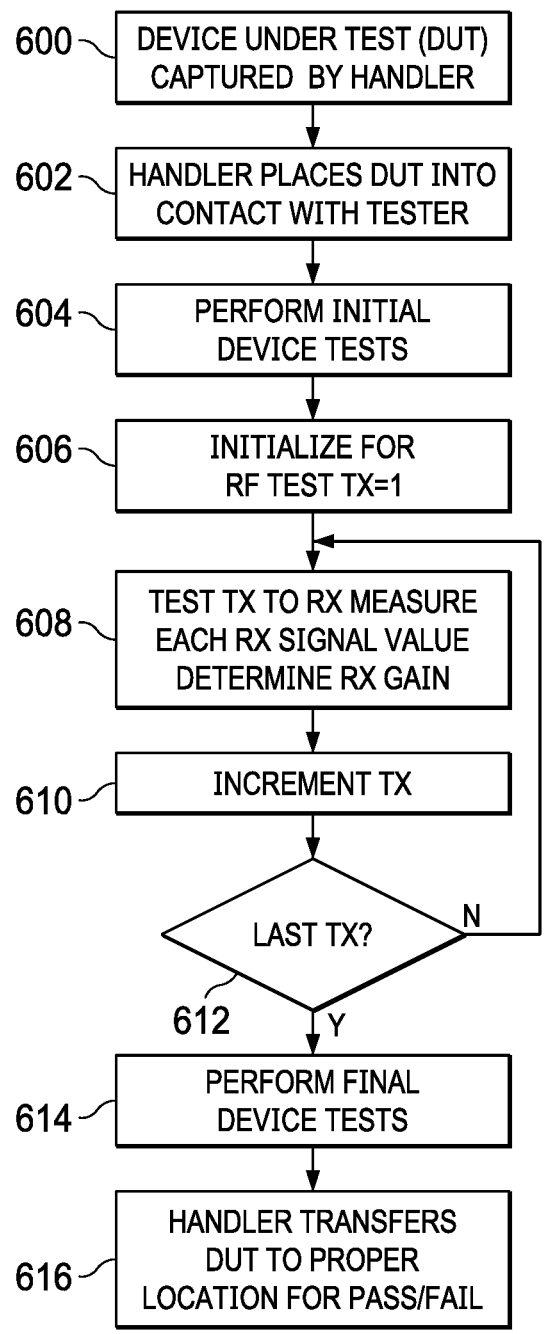
FIG. 6 is a flowchart of test operations using the antenna on package loopback substrate of FIG. 4.

FIG. 6 is a flowchart of operations to perform the tests as illustrated in FIG. 3. In step 600 the device under test (DUT), the AOP device 200, is captured by the handler no, so that the DUT is adjacent the loopback substrate 400. In step 602, the handler 110 is moved to place the AOP device 200 in contact with the tester 100, that is, in contact with the contactor 106. With the AOP device 200 now properly in place, initial device testing is performed in step 604. To commence RF and circuitry testing in step 606, a TX value is set to one, for TX1-TX3 in the design of FIGS. 2-4. In step 608, the first transmit antenna 208A is driven and the signal at each receive antenna 210A-210D is measured. The received signal is converted to receive gain to determine if the transmit to receive path is functioning within specification. After measurements and calculations are completed, in step 610 the TX value is incremented. In step 612 it is determined if the last of the transmit antennas has been tested. If not, operation returns to step 608 and the next transmit antenna 208B-208C is tested. If this was the last transmit antenna, such as transmit antenna 208C, in step 614 any final device tests are performed. In step 620 the handler no moves the AOP device 200 under test to the proper location based on a pass/fail determination of the various testing. While driving only a single transmit antenna 208A-208C has been described, driving of combinations of the transmit antennas 208A-208C is also available for more complete testing.

Figure 7A:
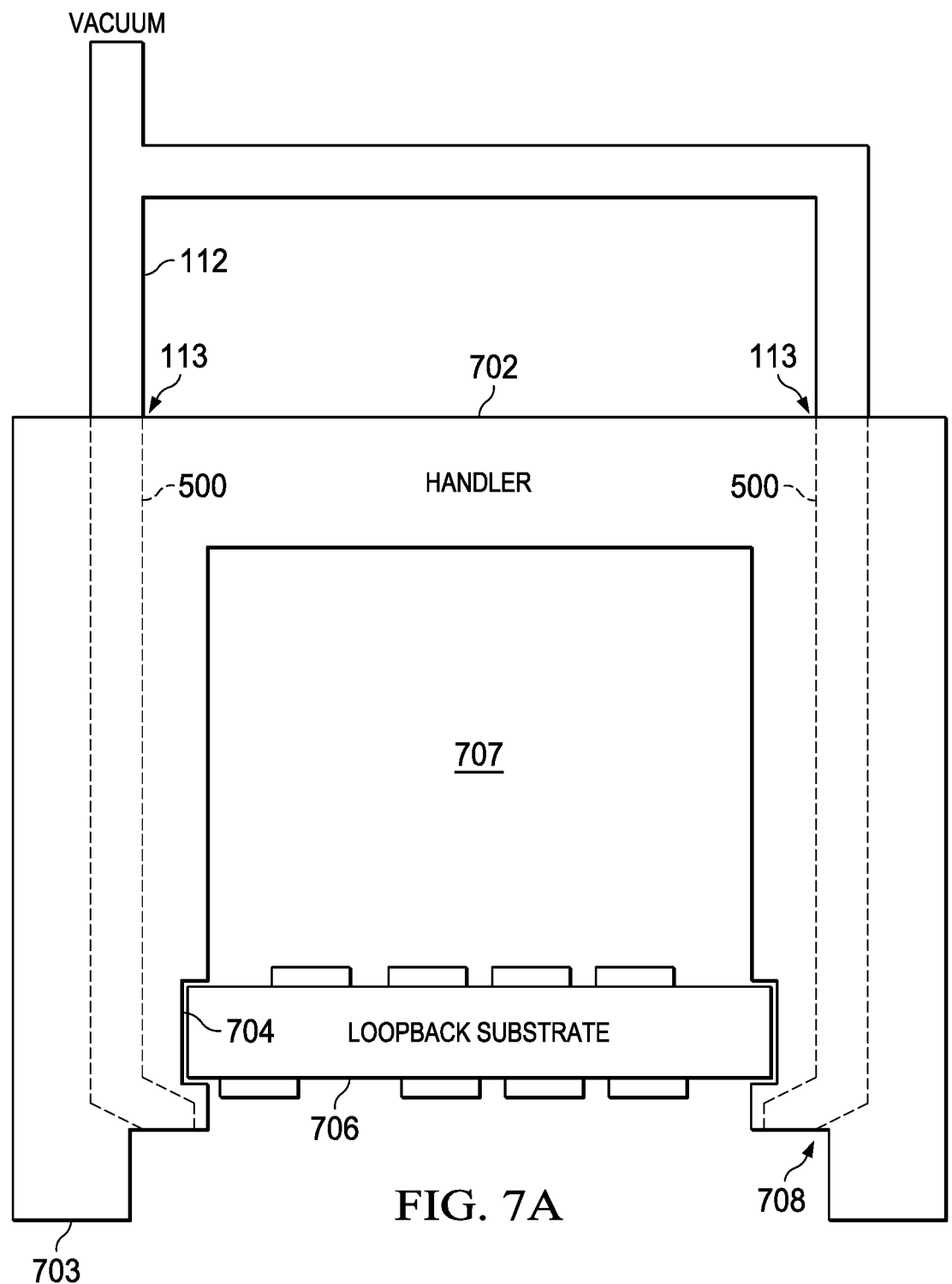
FIG. 7A is a diagram of one version of a handler for holding the antenna on package loopback substrate of FIG. 4.
Figure 7B:
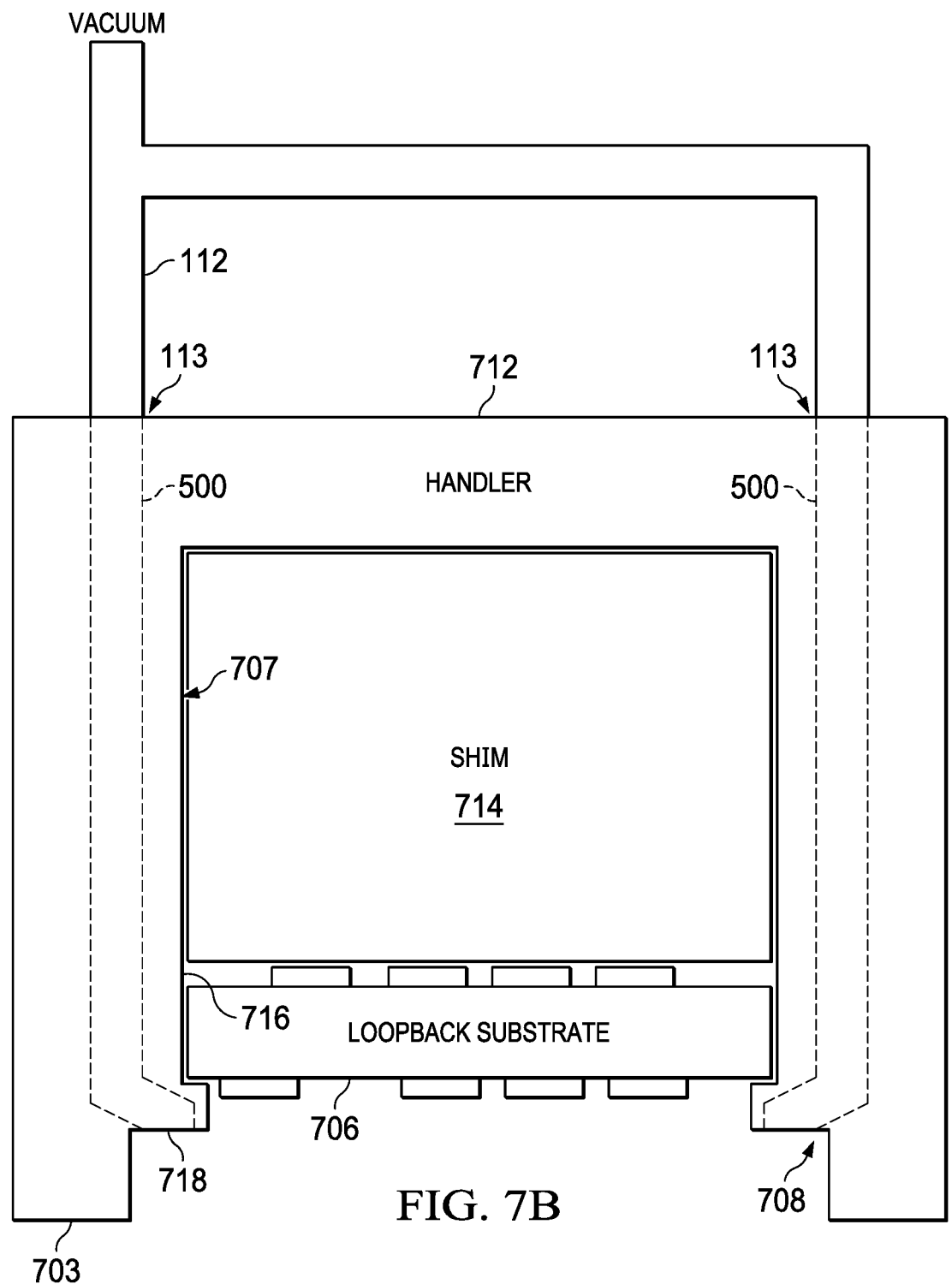
FIG. 7B is a diagram of a second version of a handler for holding the antenna on package loopback substrate of FIG. 4.

FIGS. 7A and 7B illustrate alternative handler no configurations for holding the RF loopback substrate 400. In FIG. 7A, a handler body 702 has a bottom surface 703 that contains a groove 704 sized to hold an RF loopback substrate 706. A chamber 707 inside the handler body 702 and above the RF loopback substrate 706 is an empty volume. An opening 708 is present in the handler body 702 to allow mating with the AOP device 200 under test to align the AOP device 200 and the RF loopback substrate 706. In FIG. 7B, an alternative handler body 712 as illustrated. The RF loopback substrate 706 is located in the chamber 707 and a shim 714 is present to fill up the volume of the chamber 707. The bottom or lower portion 716 of the chamber 707 includes a lip 718 to retain the RF loopback substrate 706 in the chamber 707.

It is understood that other handler body designs to hold the RF loopback substrate in proper alignment with the AOP device under test can easily be developed based on the specifics of the individual tester.

While this description has focused on antenna on package devices, the loopback substrate will also work with antenna in package (AIP) devices and other designs where the RF signals are provided directly from or received directly at the device without going through device balls or pins.

By the use of a loopback substrate containing interconnected receive and transmit antennas that are complementary to the transmit and receive antennas of an AOP package under test, testing of the RF circuitry and antennas of the AOP package can be performed as part of the normal test sequence, without any special handling or steps.

The above description is intended to be illustrative, and not restrictive. For example, the above-described examples may be used in combination with each other. Many other examples will be upon reviewing the above description. The scope should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. An apparatus for use with an integrated circuit package having a transmit antenna and a receive antenna on a top surface of the integrated circuit package, the apparatus comprising:
    a handler body including:
        a bottom surface for mating with the integrated circuit package;
        a port for receiving a vacuum line; and
        at least one line to transfer vacuum from the port to the bottom surface;
    a loopback substrate including:
        a bottom surface;
        a transmit antenna located on the bottom surface of the loopback substrate; and
        a receive antenna coupled to the loopback substrate transmit antenna and located on the bottom surface of the loopback substrate,
    wherein a location of the loopback substrate receive antenna is complementary to a location of the integrated circuit package transmit antenna to form a receive-transmit pair when operating and a location of the loopback substrate transmit antenna is complementary to a location of the integrated circuit package receive antenna to form a transmit-receive pair when operating, and
    wherein the handler body is adapted to hold the loopback substrate in a location above the bottom surface of the handler body so that a nominal gap results when the integrated circuit package is mated with the handler body.

2. The apparatus of claim 1, wherein the nominal gap is zero to 0.2 mm.

3. The apparatus of claim 1, wherein the handler body further includes:
    a groove to hold the loopback substrate; and
    a chamber above the loopback substrate.

4. The apparatus of claim 1, wherein the handler body further includes:
    a chamber above the bottom surface of the handler body, the chamber having a lip at a lower portion to retain the loopback substrate; and
    a shim located above the loopback substrate to substantially fill the volume of the chamber.

5. The apparatus of claim 1, wherein the loopback substrate further includes components on the loopback substrate to couple the loopback substrate receive antenna to the loopback substrate transmit antenna, wherein the components are passive components.

6. The apparatus of claim 1, wherein the integrated circuit package has a plurality of integrated circuit package transmit antennas or a plurality of integrated circuit package receive antennas, the plurality of integrated circuit package transmit antennas including the integrated circuit package transmit antenna or the plurality of integrated circuit package receive antennas including the integrated circuit package receive antenna, and
    wherein the loopback substrate further includes:
        a plurality of loopback substrate receive antennas coupled to the loopback substrate transmit antenna or a plurality of loopback substrate transmit antennas coupled to the loopback substrate receive antenna, the plurality of loopback substrate receive antennas including the loopback substrate receive antenna or the plurality of loopback substrate transmit antennas including the loopback substrate transmit antenna, wherein, for each of the plurality of loopback substrate receive antennas, a location of a given loopback substrate receive antenna in the plurality of loopback substrate receive antennas is complementary to a location of a respective integrated circuit package transmit antenna in the plurality of integrated circuit package transmit antennas to form receive-transmit pairs when operating, or for each of the plurality of loopback substrate transmit antennas, a location of a given loopback substrate transmit antenna in the plurality of loopback substrate transmit antennas is complementary to a location of a respective integrated circuit package receive antenna in the plurality of integrated circuit package receive antennas to form transmit-receive pairs when operating, and
        components including at least one of a radio frequency (RF) divider, RF combiner, RF splitter, RF hybrid and RF coupler to couple the plurality of loopback substrate receive antennas to the loopback substrate transmit antenna or the plurality of loopback substrate receive antennas to the loopback substrate transmit antenna.

7. The apparatus of claim 6, wherein the components include at least one Wilkinson divider and a plurality of microstrips to couple the Wilkinson divider to the plurality of loopback substrate receive antennas or the plurality of loopback substrate transmit antennas.

8. The apparatus of claim 6, wherein the integrated circuit package has a plurality of integrated circuit package transmit antennas and a plurality of integrated circuit package receive antennas, the plurality of integrated circuit package transmit antennas including the integrated circuit package transmit antenna and the plurality of integrated circuit package receive antennas including the integrated circuit package receive antenna, and
    wherein the loopback substrate includes:
        a plurality of loopback substrate receive antennas and a plurality of loopback substrate transmit antennas coupled to the plurality of loopback substrate receive antennas, the plurality of loopback substrate receive antennas including the loopback substrate receive antenna and the plurality of loopback substrate transmit antennas including the loopback substrate transmit antenna, wherein, for each of the plurality of loopback substrate receive antennas, a location of a given loopback substrate receive antenna in the plurality of loopback substrate receive antennas is complementary to a location of a respective integrated circuit package transmit antenna in the plurality of integrated circuit package transmit antennas to form receive-transmit pairs when operating, and for each of the plurality of loopback substrate transmit antennas, a location of a given loopback substrate transmit antenna in the plurality of loopback substrate transmit antennas is complementary to a location of a respective integrated circuit package receive antenna in the plurality of integrated circuit package receive antennas to form transmit-receive pairs when operating, and
        components including a plurality of Wilkinson dividers and a plurality of microstrips to couple the plurality of Wilkinson dividers to the plurality of loopback substrate receive antennas and the plurality of loopback substrate transmit antennas.

9. The apparatus of claim 6, wherein the integrated circuit package has a plurality of integrated circuit package transmit antennas and a plurality of integrated circuit package receive antennas, the plurality of integrated circuit package transmit antennas including the integrated circuit package transmit antenna and the plurality of integrated circuit package receive antennas including the integrated circuit package receive antenna, and wherein the loopback substrate further includes:
a plurality of loopback substrate receive antennas and a plurality of loopback substrate transmit antennas coupled to the plurality of loopback substrate receive antennas, the plurality of loopback substrate receive antennas including the loopback substrate receive antenna and the plurality of loopback substrate transmit antennas including the loopback substrate transmit antenna, wherein, for each of the plurality of loopback substrate receive antennas, a location of a given loopback substrate receive antenna in the plurality of loopback substrate receive antennas is complementary to a location of a respective integrated circuit package transmit antenna in the plurality of integrated circuit package transmit antennas to form receive-transmit pairs when operating, and for each of the plurality of loopback substrate transmit antennas, a location of a given loopback substrate transmit antenna in the plurality of loopback substrate transmit antennas is complementary to a location of a respective integrated circuit package receive antenna in the plurality of integrated circuit package receive antennas to form transmit-receive pairs when operating, and components including a plurality of any of RF dividers, RF combiners, RF splitters, RF hybrids and RF couplers and a plurality of microstrips to couple the plurality of any of RF dividers, RF combiners, RF splitters, RF hybrids and RF couplers to the plurality of loopback substrate receive antennas and the plurality of loopback substrate transmit antennas.

10. A loopback substrate for use with an integrated circuit package having a transmit antenna and a receive antenna located on a top surface of the integrated circuit package, the loopback substrate including:
a bottom surface;
a transmit antenna located on the bottom surface of the loopback substrate; and
a receive antenna located on the bottom surface of the loopback substrate and coupled to the loopback substrate transmit antenna,
wherein a location of the loopback substrate receive antenna is complementary to a location of the integrated circuit package transmit antenna to form a receive-transmit pair when operating and a location of the loopback substrate transmit antennas is complementary to a location of the integrated circuit package receive antenna to form a transmit-receive pair when operating.

11. The loopback substrate of claim 10, further comprising:
components on the loopback substrate to couple the loopback substrate receive antenna to the loopback substrate transmit antenna, wherein the components are passive components.

12. The loopback substrate of claim 10, wherein the integrated circuit package has a plurality of integrated circuit package transmit antennas or a plurality of integrated circuit package receive antennas, the plurality of integrated circuit package transmit antennas including the integrated circuit package transmit antenna or the plurality of integrated circuit package receive antennas including the integrated circuit package receive antenna, and wherein the loopback substrate further comprises:
a plurality of loopback substrate receive antennas coupled to the loopback substrate transmit antenna or a plurality of loopback substrate transmit antennas coupled to the loopback substrate receive antenna, the plurality of loopback substrate receive antennas including the loopback substrate receive antenna or the plurality of loopback substrate transmit antennas including the loopback substrate transmit antenna, wherein, for each of the plurality of loopback substrate receive antennas, a location of a given loopback substrate receive antenna in the plurality of loopback substrate receive antennas is complementary to a location of a respective integrated circuit package transmit antenna in the plurality of integrated circuit package transmit antennas to form receive-transmit pairs when operating, or for each of the plurality of loopback substrate transmit antennas, a location of a given loopback substrate transmit antenna in the plurality of loopback substrate transmit antennas is complementary to a location of a respective integrated circuit package receive antenna in the plurality of integrated circuit package receive antennas to form transmit-receive pairs when operating, and components including at least one of a radio frequency (RF) divider, RF combiner, RF splitter, RF hybrid and RF coupler to couple the plurality of loopback substrate receive antennas to the loopback substrate transmit antenna or the plurality of loopback substrate receive antennas to the loopback substrate transmit antenna.

13. The loopback substrate of claim 12, wherein the components include at least one Wilkinson divider and a plurality of microstrips to couple the Wilkinson divider to the plurality of loopback substrate receive antennas or the loopback substrate plurality of transmit antennas.

14. The loopback substrate of claim 12, wherein the integrated circuit package has a plurality of transmit antennas and a plurality of receive antennas, the plurality of integrated circuit package transmit antennas including the integrated circuit package transmit antenna and the plurality of integrated circuit package receive antennas including the integrated circuit package receive antenna, and wherein the loopback substrate further comprises:
a plurality of loopback substrate receive antennas and a plurality of loopback substrate transmit antennas coupled to the plurality of loopback substrate receive antennas, the plurality of loopback substrate receive antennas including the loopback substrate receive antenna and the plurality of loopback substrate transmit antennas including the loopback substrate transmit antenna, wherein, for each of the plurality of loopback substrate receive antennas, a location of a given loopback substrate receive antenna in the plurality of loopback substrate receive antennas is complementary to a location of a respective integrated circuit package transmit antenna in the plurality of integrated circuit package transmit antennas to form receive-transmit pairs when operating, and for each of the plurality of loopback substrate transmit antennas, a location of a given loopback substrate transmit antenna in the plurality of loopback substrate transmit antennas is complementary to a location of a respective integrated circuit package receive antenna in the plurality of integrated circuit package receive antennas to form transmit-receive pairs when operating, and components including a plurality of Wilkinson dividers and a plurality of microstrips to couple the plurality of Wilkinson dividers to the plurality of loopback substrate receive antennas and the plurality of loopback substrate transmit antennas.

15. The loopback substrate of claim 12, wherein the integrated circuit package has a plurality of integrated circuit package transmit antennas and a plurality of integrated circuit package receive antennas, the plurality of integrated circuit package transmit antennas including the integrated circuit package transmit antenna and the plurality of integrated circuit package receive antennas including the integrated circuit package receive antenna, and wherein the loopback substrate further comprises:
 a plurality of loopback substrate receive antennas and a plurality of loopback substrate transmit antennas coupled to the plurality of loopback substrate receive antennas, the plurality of loopback substrate receive antennas including the loopback substrate receive antenna and the plurality of loopback substrate transmit antennas including the loopback substrate transmit antenna, wherein, for each of the plurality of loopback substrate receive antennas, a location of a given loopback substrate receive antenna in the plurality of loopback substrate receive antennas is complementary to a location of a respective integrated circuit package transmit antenna in the plurality of integrated circuit package transmit antennas to form receive-transmit pairs when operating, and for each of the plurality of loopback substrate transmit antennas, a location of a given loopback substrate transmit antenna in the plurality of loopback substrate transmit antennas is complementary to a location of a respective integrated circuit package receive antenna in the plurality of integrated circuit package receive antennas to form transmit-receive pairs when operating, and components including a plurality of any of RF dividers, RF combiners, RF splitters, RF hybrids and RF couplers and a plurality of microstrips to couple the plurality of any of RF dividers, RF combiners, RF splitters, RF hybrids and RF couplers to the plurality of loopback substrate receive antennas and the plurality of loopback substrate transmit antennas.

16. A method of testing an integrated circuit package having a transmit antenna and a receive antenna located on a top surface of the integrated circuit package and a plurality of electrical contacts located on a bottom surface of the integrated circuit package, the method comprising:

locating a loopback substrate adjacent the top surface of the integrated circuit package, the loopback substrate including:
 a bottom surface;
 a transmit antenna located on the bottom surface of the loopback substrate; and
 a receive antenna coupled to the loopback substrate transmit antenna and located on the bottom surface of the loopback substrate,
 wherein a location of the loopback substrate receive antenna is complementary to a location of the integrated circuit package transmit antenna to form a receive-transmit pair when operating and a location of the loopback substrate transmit antenna is complementary to a location of the integrated circuit package receive antenna to form a transmit-receive pair when operating;

providing electrical signals to the plurality of electrical contacts of the integrated circuit package to cause signals to be driven by the integrated circuit package transmit antenna on the integrated circuit package to the loopback substrate receive antenna and to be received by the integrated circuit package receive antenna on the integrated circuit package from the loopback substrate transmit antenna; and monitoring the plurality of electrical contacts of the integrated circuit package to evaluate the signals received at the integrated circuit package receive antenna when the integrated circuit package transmit antenna is being driven.

17. The method of claim 16, wherein the adjacent location of the bottom surface of the loopback substrate is a nominal distance from the top surface of the integrated circuit package.

18. The method of claim 17, wherein the nominal distance is zero to 0.2 mm.

19. The method of claim 16, wherein the integrated circuit package has a plurality of integrated circuit package transmit antennas or a plurality of integrated circuit package receive antennas, the plurality of integrated circuit package transmit antennas including the integrated circuit package transmit antenna or the plurality of integrated circuit package receive antennas including the integrated circuit package receive antenna, and wherein the loopback substrate further includes:
 a plurality of loopback substrate receive antennas coupled to the loopback substrate transmit antenna or a plurality of loopback substrate transmit antennas coupled to the loopback substrate receive antenna, the plurality of loopback substrate receive antennas including the loopback substrate receive antenna or the plurality of loopback substrate transmit antennas including the loopback substrate transmit antenna, wherein, for each of the plurality of loopback substrate receive antennas, a location of a given loopback substrate receive antenna in the plurality of loopback substrate receive antennas is complementary to a location of a respective integrated circuit package transmit antenna in the plurality of integrated circuit package transmit antennas to form receive-transmit pairs when operating, or for each of the plurality of loopback substrate transmit antennas, a location of a given loopback substrate transmit antenna in the plurality of loopback substrate transmit antennas is complementary to a location of a respective integrated circuit package receive antenna in the plurality of integrated circuit package receive antennas to form transmit-receive pairs when operating, and components including at least one Wilkinson divider and a plurality of microstrips to couple the Wilkinson divider to the plurality of loopback substrate receive antennas or the plurality of loopback substrate transmit antennas.

20. The method of claim 16, wherein the integrated circuit package has a plurality of integrated circuit package transmit antennas and a plurality of integrated circuit package receive antennas, the plurality of integrated circuit package transmit antennas including the integrated circuit package transmit antenna and the plurality of integrated circuit package receive antennas including the integrated circuit package receive antenna, and wherein the loopback substrate further includes:

a plurality of loopback substrate receive antennas and a plurality of loopback substrate transmit antennas coupled to the plurality of loopback substrate receive antennas, the plurality of loopback substrate receive antennas including the loopback substrate receive antenna and the plurality of loopback substrate transmit antennas including the loopback substrate transmit antenna, wherein, for each of the plurality of loopback substrate receive antennas, a location of a given loopback substrate receive antenna in the plurality of loopback substrate receive antennas is complementary to a location of a respective integrated circuit package transmit antenna in the plurality of integrated circuit package transmit antennas to form receive-transmit pairs when operating, and for each of the plurality of loopback substrate transmit antennas, a location of a given loopback substrate transmit antenna in the plurality of loopback substrate transmit antennas is complementary to a location of a respective integrated circuit package receive antenna in the plurality of integrated circuit package receive antennas to form transmit-receive pairs when operating, and components including a plurality of Wilkinson dividers and a plurality of microstrips to couple the plurality of Wilkinson dividers to the plurality of loopback substrate receive antennas and the plurality of loopback substrate transmit antennas.

\* \* \* \* \*